United States Patent [19]
Fukuzawa

[11] Patent Number: 5,629,805
[45] Date of Patent: May 13, 1997

[54] ALIGNER EQUIPPED WITH ANNULAR ILLUMINATION SYSTEM FOR ANNULAR ILLUMINATION LIGHT WITH LARGE ILLUMINANCE

[75] Inventor: Shinichi Fukuzawa, Tokyo, Japan

[73] Assignee: NEC Corporation, Tokyo, Japan

[21] Appl. No.: 339,678

[22] Filed: Nov. 14, 1994

[30] Foreign Application Priority Data

Nov. 15, 1993 [JP] Japan ................... 5-308689

[51] Int. Cl.$^6$ ............... G02B 27/10; G02B 5/08; G03B 27/52
[52] U.S. Cl. ............... 359/627; 359/857; 355/53; 355/67
[58] Field of Search ............... 359/362–367, 359/558–566, 619, 627, 631, 618; 356/399–401; 355/53, 55, 67, 52

[56] References Cited

U.S. PATENT DOCUMENTS

| | | | |
|---|---|---|---|
| 5,237,367 | 8/1993 | Kudo | 355/53 |
| 5,303,001 | 4/1994 | Jeong et al. | 355/53 |
| 5,309,198 | 5/1994 | Nakagawa | 355/67 |
| 5,335,044 | 8/1994 | Shiraishi | 355/53 |
| 5,382,999 | 1/1995 | Kamon | 355/53 |

FOREIGN PATENT DOCUMENTS

| | | |
|---|---|---|
| 62-2618 | 1/1987 | Japan . |
| 2-309626 | 12/1990 | Japan . |

OTHER PUBLICATIONS

Keiichiro Tounai et al., "Resolution improvement with annular illumination", *SPIE vol. 1674 Optical/Laser Microlithography V,* 1992, pp. 753–764.

Delmer L. Fehrs et al., "Illuminator Modification of an Optical Aligner", *KTI Microelectronics Seminar,* 1989, pp. 217–230.

Naomasa Shiraishi et al., "New Imaging Technique for 64M–DRAM", *SPIE vol. 1674 Optical/Laser Microlithography V,* 1992, pp. 741–752.

*Primary Examiner*—Thong Nguyen
*Attorney, Agent, or Firm*—Sughrue, Mion, Zinn, Macpeak & Seas

[57] ABSTRACT

A reduction projecting aligner preliminary forming an annular illumination light from a laser beam for increasing the illuminance transferred to the reticle and utilizing an annular illumination light that is obliquely incident on a reticle so that a pattern image of the reticle is rapidly printed on a photo-resist layer in high resolution.

5 Claims, 5 Drawing Sheets

ALIGNER EQUIPPED WITH ANNULAR ILLUMINATION SYSTEM FOR ANNULAR ILLUMINATION LIGHT WITH LARGE ILLUMINANCE

FIELD OF THE INVENTION

This invention relates to an aligner used in a lithographic process for transferring a pattern to a photo-sensitive layer and, more particularly, to an aligner equipped with an annular illumination system.

DESCRIPTION OF THE RELATED ART

Conventionally, a reduction projection aligner is used in a process of fabricating an integrated circuit on a semiconductor substrate for transferring a pattern with a line width not greater than 1 micron.

A typical example of the reduction projection aligner is disclosed in Japanese Patent Publication of Unexamined Application No. 2-309626, and FIG. 1 illustrates a standard reduction projection aligner. The prior art standard reduction projection aligner comprises a movable stage 1 for mounting a semiconductor substrate 2 covered with a photo-resist layer 3 and a projection system 4 for transferring a pattern of a reticle 5 to the photo-resist layer 3.

The projection system 4 comprises a mercury lamp 4a for radiating a light beam 6a, a beam shaping optical system 4b, a fly-eye lens unit 4c for producing parallel rays, a stop 4d for regulating the amount of light, a condenser lens 4e for illuminating the reticle 5 and a projection lens unit 4f for imaging the pattern in the photo-resist 3. The parallel rays are uniformly incident on the fly-eye lens 4c.

In order to improve the resolution of the standard reduction projection aligner, Keiichiro Tounai et al. report a reduction projection aligner in "Resolution improvement with annular illumination", SPIE Vol. 1674 Optical/Laser Microlithography V(1992), pages 753 to 764, and Delmer L. Fehrs et al. also report an annulus of light in "ILLUMINATOR MODIFICATION OF A OPTICAL ALIGNER", KTI Microelectronics seminar (1989), pages 217 to 230.

In the standard reduction projection aligner, the stop 4d has a circular aperture 4g as shown in FIG. 2A. However, the annular illumination system is equipped with a stop 7 beneath the fly-eye lens instead of the stop 4d as shown in FIG. 1 of the SPIE paper, and an annular aperture 7a is formed in the stop 7 as shown in FIG. 2B.

The annular aperture 7a shapes the parallel rays into annular illumination, and 0-order light component vertically incident on the reticle 5 is eliminated from the transmitted light. An oblique-incident 0-order light component OR0 is available for a pattern transfer, and the angle AG1 of diffraction between the oblique-incident 0-order light component and the 1-order light component OR1/1-order light component -OR1 is so large that the angle AG2 on the imagery surface is larger than the angle AG3 in the illumination system with the circular aperture 4g due to the vertical-incident 0-order light component OR0', 1-order light component OR1' and −1-order light component-OR1' (see FIG. 4B). This results in improvement of the resolution, the contrast and the depth of focus.

Another prior art annular illumination system is disclosed in Japanese Patent Publication of Unexamined Application No. 62-2618, and FIG. 4 illustrates the prior art annular illumination system. In FIG. 4, an ultra high pressure mercury lamp 8 is placed at the first focus of an elliptic reflecting mirror 9, and an inlet end 10a of a bundle 10 of optical fibers are placed at the second focus of the elliptic reflecting mirror 9. The outlet end 10b of the bundle 10 are spread in such a manner as to form a circular arc, and radiates rays to a reticle 11.

The ultra high pressure mercury lamp 9 radiates light, and the light is focused on the inlet end of the bundle 10. The optical fibers guide the light, and the radiated rays form the circular arc.

The annular illumination system is desirable rather than the circular illumination system of the standard reduction projection aligner as described hereinbefore. However, the prior art annular illumination system shown in FIG. 3A encounters a problem in the amount of light illuminating the reticle 5. Namely, the parallel rays from the fly-eye lens illuminate the entire surface of the stop 7, and only part of the parallel rays pass through the annular aperture 7a. The small amount of light can not rapidly transfer the pattern from the reticle to the photo-resist layer 3, and the prior art aligner equipped with the annular illumination system suffers from a low throughput.

However, the prior art annular illumination system shown in FIG. 4 achieves a higher throughput than the prior art aligner shown in FIG. 3A, because the circular-arc light directly illuminates the reticle 11. However, the light radiated from the outlet end 10b vertically radiates the reticle 11, and the pattern is transmitted by the vertical-incident 0-order light component. Therefore, the prior art aligner equipped to the annular illumination system suffers from low resolution, low contrast and insufficient depth of focus.

SUMMARY OF THE INVENTION

It is therefore an important object of the present invention to provide an aligner which improves the resolution, the contrast and the depth of focus without sacrifice of the throughput.

To accomplish the object, the present invention proposes to form an annular illumination before passing through an annular aperture.

In accordance with the present invention, there is provided an aligner comprising: a light source section for radiating a light; a reticle holder for retaining a reticle having a transparent pattern; an annular illuminating section provided between the light source and the reticle, and having a condenser means operative to condense the light into an annular illumination light, and an oblique illumination means for obliquely illuminating the reticle with the annular illumination light so as to cause an oblique-incident 0-order light component of the annular illumination light to transfer a pattern image of the transparent pattern of the reticle; and a movable stage holding a photo-sensitive layer to which the transparent pattern is transferred.

BRIEF DESCRIPTION OF THE DRAWINGS

The features and advantages of the aligner according to the present invention will be more clearly understood from the following description taken in conjunction with the accompanying drawings in which.

DESCRIPTION OF THE PREFERRED EMBODIMENT

Figure 5:
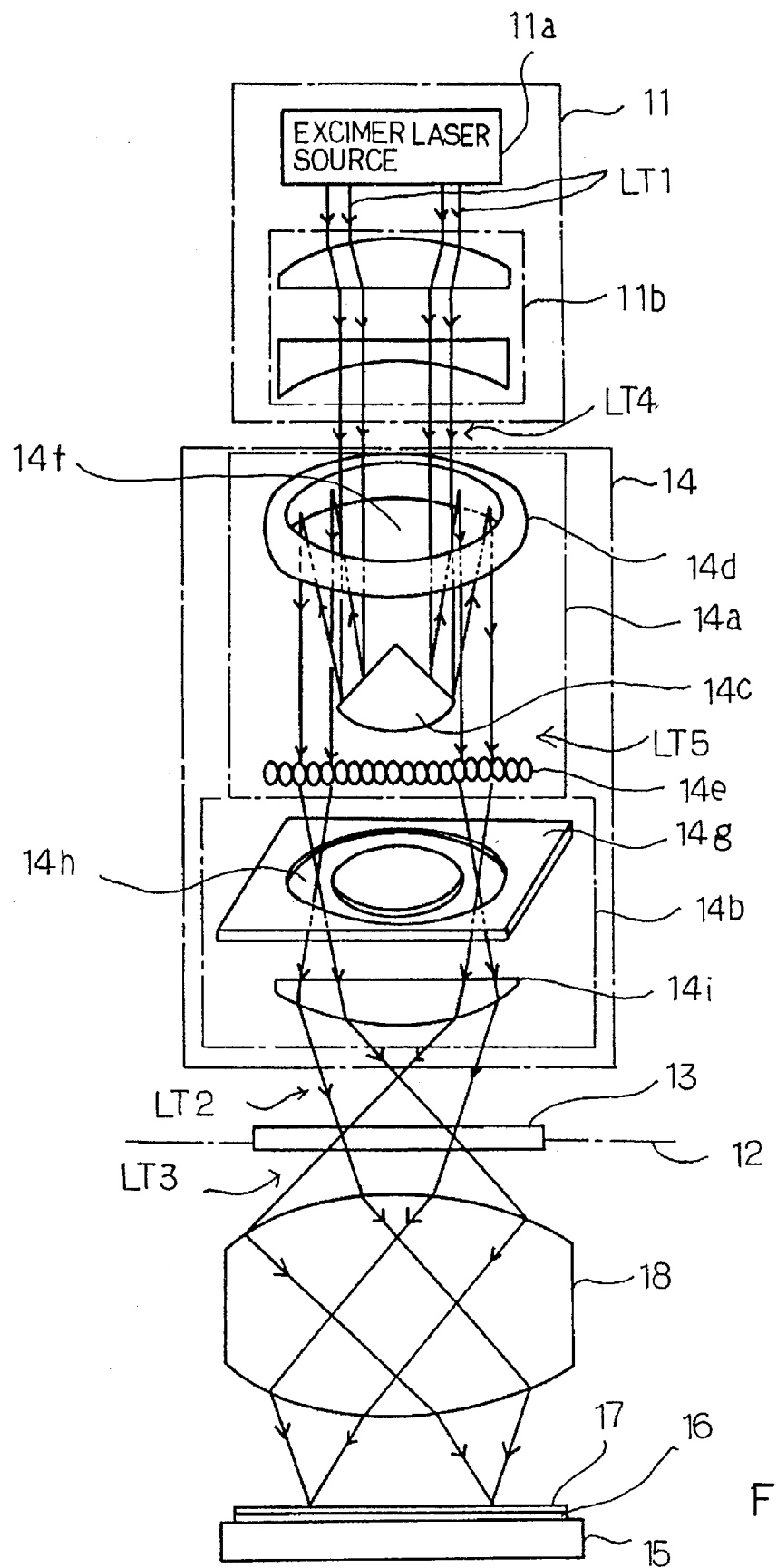
FIG. 5 is a schematic view showing an aligner according to the present invention.

Referring to FIG. 5 of the drawings, a reduction projecting aligner embodying the present invention largely comprises a light source section 11 for radiating a laser light LT1, a reticle holder 12 for retaining a reticle 13 with a transparent pattern, an annular illuminating section 14 operative to produce an annular illumination light LT2 from the laser light LT1 for causing an oblique-incident 0-order light component of the annular light to transfer an image of the transparent pattern through the reticle 13, a movable stage 15 mounting a semiconductor wafer 16 covered with a photo-resist layer 17 and a projection lens unit 18 for focusing a pattern carrying light LT3 on the photo-resist layer 17.

The light source section 11 comprises an excimer laser source 11a for radiating the laser light LT1 with wavelength of 248 nanometers and a condenser lens unit 11b for forming a laser beam LT4 from the laser light LT1. The laser beam LT4 is radiated to the annular illuminating section 14.

The annular illuminating section 14 is broken down into a condenser sub-section 14a for forming a preliminary annular illumination light LT5 from the laser beam LT4 and an oblique illumination sub-section 14b for obliquely illuminating the reticle 13. The condenser sub-section 14a is implemented by the combination of a circular cone-shaped reflecting mirror 14c, a ring-shaped reflecting mirror 14d and a fly-eye lens 14e, and the circular cone-shaped reflecting mirror 14c is placed under circular aperture 14f of the ring-shaped reflecting mirror 14d. The laser beam LT4 passes through the circular aperture 14f, and is reflected on the outer surface of the circular cone-shaped reflecting mirror 14c. The reflected laser beam LT4 is incident on the inner surface of the ring-shaped reflection mirror 14d, and is reflected toward the fly-eye lens 14e. While the circular cone-shaped reflecting mirror 14c and the ring-shaped reflecting mirror 14d are reflecting the laser beam LT4, the laser beam LT4 is increased in illuminance, and is shaped into the preliminary annular illumination light LT5. The fly-eye lens 14e shapes the preliminary annular illumination light LT5 into parallel rays, and radiates the preliminary annular illumination light toward the oblique illumination sub-section 14b.

The oblique illuminating sub-section 14b comprises a plate member 14g with an annular aperture 14h or an annular transparent area, and a condenser lens 14i or an illumination lens. The preliminary annular illumination light passes through the annular aperture 14h, and is obliquely incident on the illumination lens 14i. The illumination lens 14i concentrates the preliminary annular illumination LT5 into an annular illumination light, and causes the annular illumination light LT2 to be obliquely incident on the reticle 13.

While the annular illumination light LT2 is passing through the transparent pattern of the reticle 13, a 0-order light component vertically incident one the reticle 13 is eliminated from the annular illumination light LT2, and allows a 0-order light component obliquely incident on the reticle 13 to carry the pattern image defined by the pattern. The pattern carrying light LT3 is incident on the projection lens unit 18, and falls onto the photo-resist layer 17.

Figure 1:
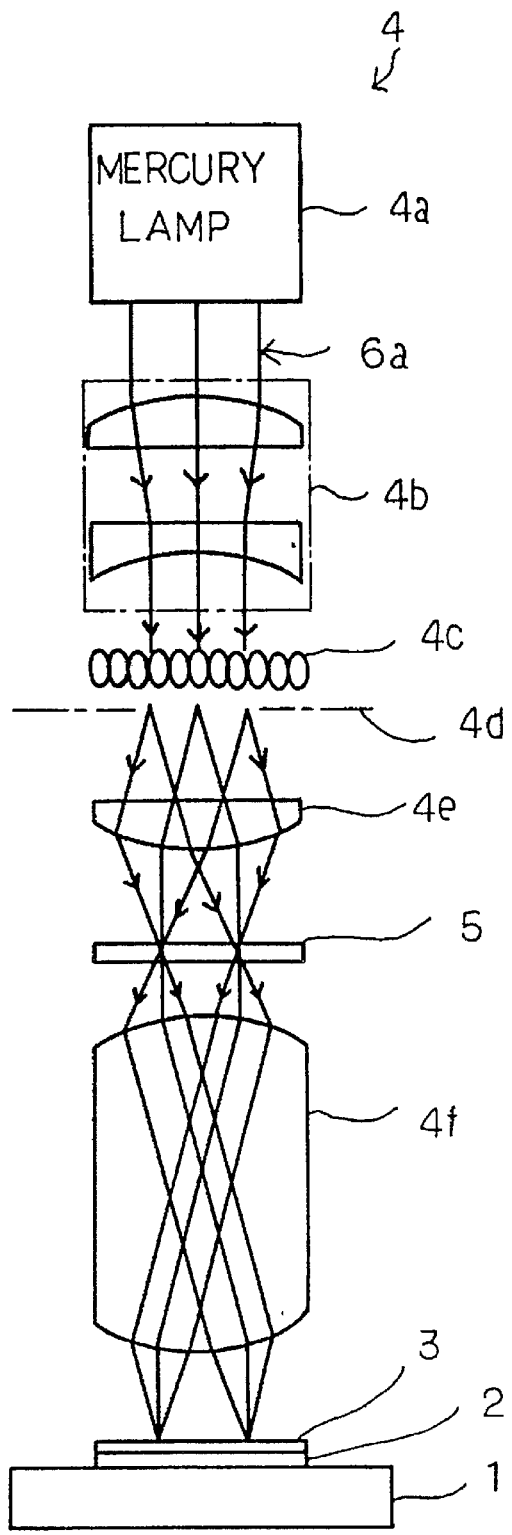
FIG. 1 is a schematic view showing the standard reduction projection aligner.
Figure 2A:
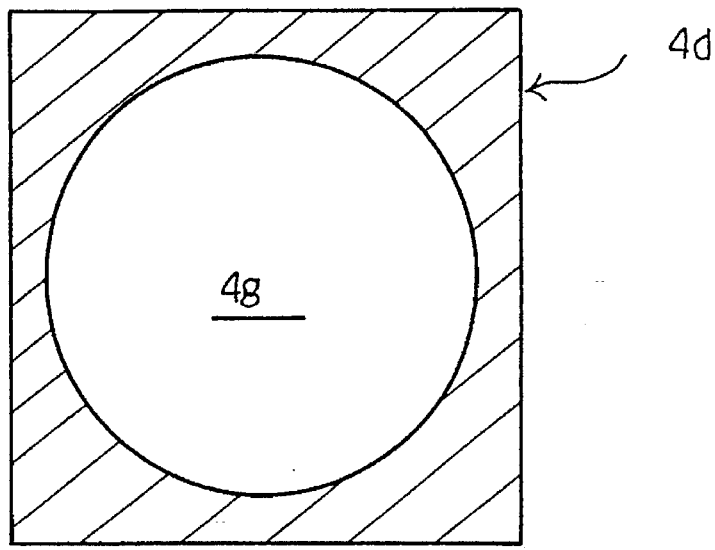
FIG. 2A is a plan view showing the stop with the circular aperture incorporated in the standard reduction projection aligner.
Figure 2B:
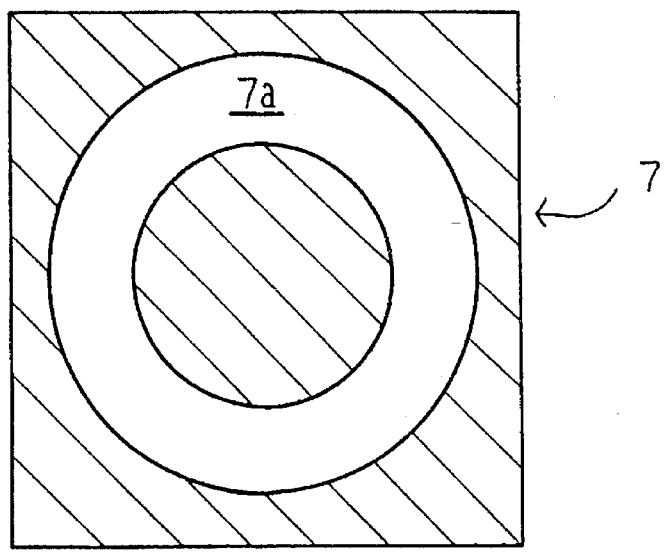
FIG. 2B is a plan view showing the stop with the annular aperture incorporated in the prior art annular illumination system.
Figure 3A:
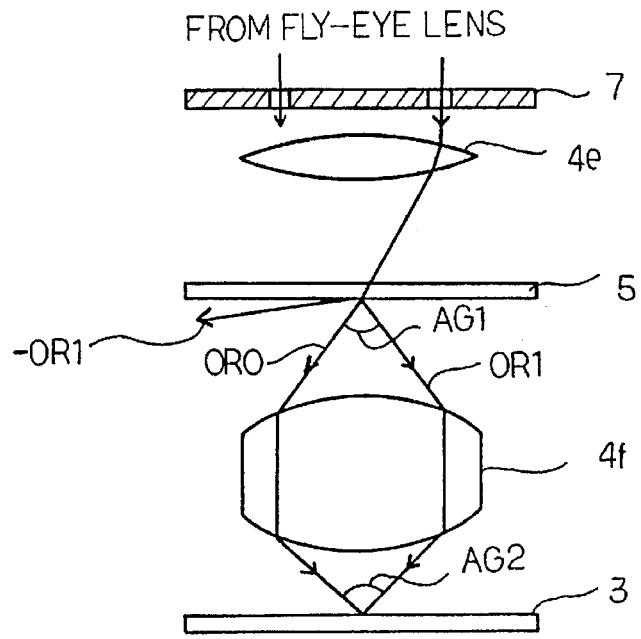
FIG. 3A is a schematic view showing the prior art annular illumination system.
Figure 3B:
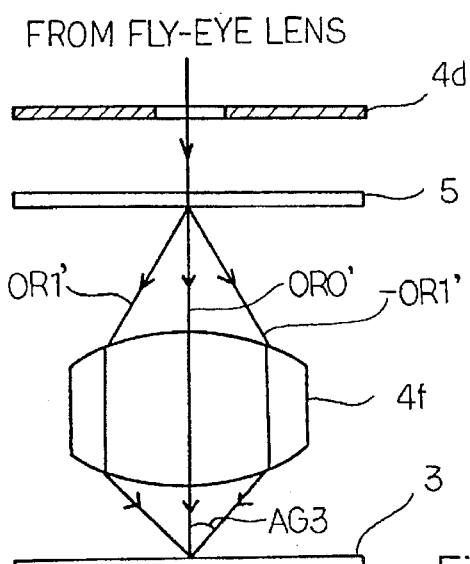
FIG. 3B is a schematic view showing the prior art illumination system incorporated in the standard reduction production aligner.
Figure 4:
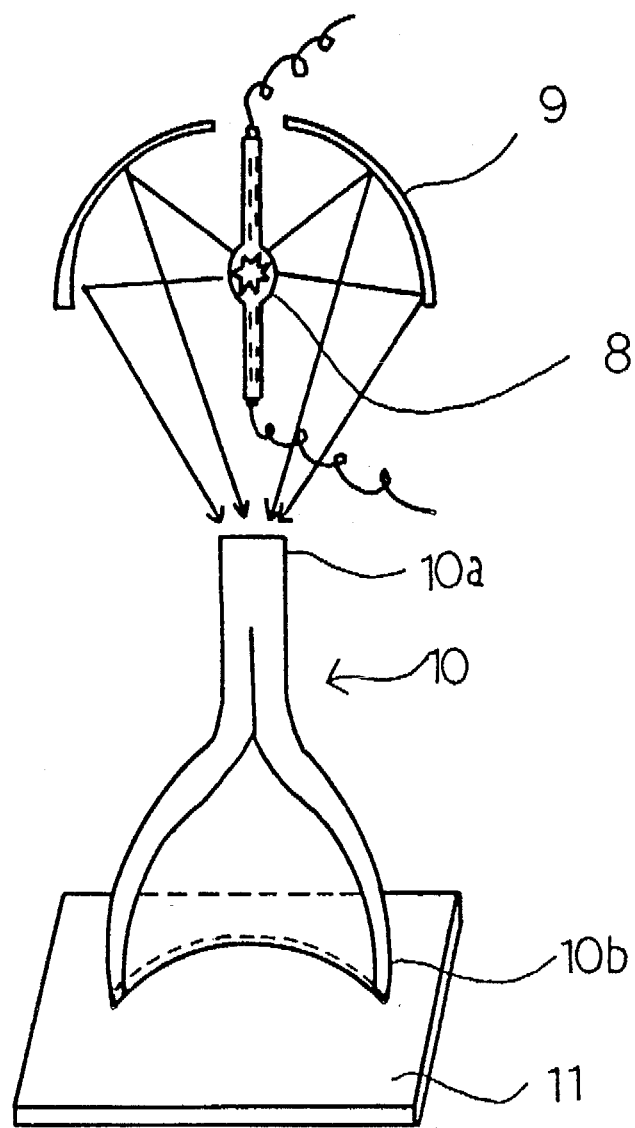
FIG. 4 is a schematic view showing another prior art annular illumination system.

Since the pattern carrying light LT3 contains the oblique-incident 0-order light component, an oblique-incident +1-order light component and an oblique-incident −1-order light component, interference is effectively restricted. As a result, the resolution, the contrast and the depth of focus are surely improved compared to the prior art annular illumination system shown in FIG. 4. Moreover, the combination of the circular cone-shaped reflecting mirror 14c and the ring-shaped reflection mirror 14d increases the illuminance of the preliminary annular illumination light LT5 and, accordingly, the annular illumination light LT2 and the pattern carrying light, and the pattern is rapidly printed in the photo-resist layer 17. As a result, the rapid printing improves the throughput of the aligner.

As will be appreciated from the foregoing description, the condenser sub-section 14a increases the illuminance of the preliminary annular illumination light LT5 from the laser beam LT4, Therefore, the pattern carrying light LT3 rapidly prints the photo-resist layer 17, and the aligner according to the present invention is improved in throughput. Moreover, the annular aperture 14h and the illumination lens 14i cause the annular illumination light to be obliquely incident on the reticle 13, and allows the reticle 13 to eliminate the vertical-incident 0-order light component from the annular illumination light LT5. As a result, the oblique-incident 0-order light component transfers the pattern image to the photo-resist layer 17. This results in improvement in the resolution, the contrast and the depth of focus without sacrifice of the throughput.

Although a particular embodiment of the present invention has been shown and described, it will be obvious to those skilled in the art that various changes and modifications may be made without departing from the spirit and scope of the present invention. For example, the present invention is applicable to any type of aligner such as, for example, a 1:1 projection aligner, and the wavelength of the light does not set a limit on the applicable aligner. The light component selecting means is expected to cause the annular illumination light to be obliquely incident on the reticle. For this reason, a plate member with a circular aperture may be incorporated in another aligner, or the plate member may be removed from the aligner in so far as the annular illumination light is obliquely incident on the reticle.

What is claimed is:

1. An aligner comprising:
   a light source section for radiating a laser light;
   a reticle holder for retaining a reticle having a transparent pattern;
   an annular illuminating section provided between said light source section and said reticle, and having
   a condenser means for condensing said laser light into an annular illumination light comprising:
      a cone-shaped reflecting mirror placed in an optical path of said laser light and having an outer surface for reflecting said laser light,
      a ring-shaped reflecting mirror having an aperture for transferring said laser light to said outer surface of said cone-shaped reflecting mirror and an inner surface for reflecting the laser light reflected from said outer surface of said cone-shaped reflecting mirror for producing said annular illumination light, and
      a fly-eye lens for shaping said annular illumination light into parallel rays;

an oblique illumination means for obliquely illuminating said reticle with said annular illumination light so as to cause an oblique-incident 0-order light component of said annular illumination light to transfer a pattern image of said transparent pattern formed in said reticle; and a movable stage for holding a photo-sensitive layer to which said transparent pattern is transferred.

2. The aligner as set forth in claim 1, in which said cone-shaped reflecting mirror has a circular cone-shaped configuration.

3. The aligner as set forth in claim 1, in which said oblique illumination means comprises a plate member having a transparent annular area for allowing said annular illumination light to obliquely pass therethrough, and an illumination lens for causing said annular illumination light passing through said transparent annular area to be obliquely incident on said reticle.

4. The aligner as set forth in claim 1, further comprising a projecting lens unit provided between said reticle and said photo-sensitive layer.

5. An aligner comprising:

a light source for radiating a laser light;

a circular cone-shaped reflecting mirror placed on an optical path of said laser light and having an outer surface for reflecting said laser light thereon;

a ring-shaped reflecting mirror having:

a center aperture for transferring said laser light to said outer surface of said circular cone-shaped reflecting mirror, and an inner surface defining said center aperture and reflecting said laser light reflected from said outer surface of said circular cone-shaped reflecting mirror for forming an annular illumination light;

a fly-eye lens for shaping said annular illumination light into parallel rays;

a plate member having a transparent annular aperture, said parallel rays of said annular illumination light obliquely passing said transparent annular aperture;

a reticle holder for retaining a reticle having a transparent pattern;

a condenser lens for causing said parallel rays of said annular illumination light to be obliquely incident on said reticle so that an oblique-incident 0-order light component of said annular illumination light carriers a pattern image of said transparent pattern;

a stage holding a photo-sensitive layer covering a semiconductor wafer, said oblique-incident 0-order light component printing said pattern image in said photo-sensitive layer; and a projection lens unit positioned between said reticle holder and said photo-sensitive layer.

* * * * *